United States Patent
Li et al.

(10) Patent No.: US 8,836,079 B2
(45) Date of Patent: Sep. 16, 2014

(54) METAL-ON-METAL (MOM) CAPACITORS HAVING LATERALLY DISPLACED LAYERS, AND RELATED SYSTEMS AND METHODS

(71) Applicant: QUALCOMM Incorporated, San Diego, CA (US)

(72) Inventors: Xia Li, San Diego, CA (US); Bin Yang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 13/748,768

(22) Filed: Jan. 24, 2013

(65) Prior Publication Data

US 2014/0203401 A1 Jul. 24, 2014

(51) Int. Cl.
*H01L 21/02* (2006.01)

(52) U.S. Cl.
USPC ............ 257/532; 257/306; 257/E21.002; 257/E21.09; 257/E21.011; 438/957

(58) Field of Classification Search
CPC . H01L 23/5223; H01L 23/5222; H01L 28/40; H01L 28/86; H01L 28/90
USPC ................... 257/532, 306; 438/957
See application file for complete search history.

(56) References Cited

U.S. PATENT DOCUMENTS

| | | | |
|---|---|---|---|
| 5,583,359 A * | 12/1996 | Ng et al. ............. | 257/306 |
| 6,542,351 B1 | 4/2003 | Kwang | |
| 6,661,638 B2 | 12/2003 | Jackson et al. | |
| 8,207,569 B2 | 6/2012 | Bang | |
| 8,314,452 B2 | 11/2012 | Riess et al. | |
| 2005/0135042 A1 | 6/2005 | Chiu-Kit Fong et al. | |
| 2009/0160020 A1* | 6/2009 | Barth et al. ............ | 257/532 |
| 2012/0092806 A1 | 4/2012 | Hua et al. | |
| 2012/0104387 A1 | 5/2012 | Chen et al. | |
| 2012/0104552 A1* | 5/2012 | Kim et al. ............. | 257/535 |

FOREIGN PATENT DOCUMENTS

WO 9627907 A1 9/1996

OTHER PUBLICATIONS

International Search Report and Written Opinion for PCT/US2014/012329 mailed May 13, 2014, 12 pages.

* cited by examiner

*Primary Examiner* — A. Sefer
(74) *Attorney, Agent, or Firm* — Withrow & Terranova, PLLC

(57) ABSTRACT

Metal-on-Metal (MoM) capacitors having laterally displaced layers and related systems and methods are disclosed. In one embodiment, a MoM capacitor includes a plurality of vertically stacked layers that are laterally displaced relative to one another. Lateral displacement of the layers minimizes cumulative surface process variations making a more reliable and uniform capacitor.

22 Claims, 13 Drawing Sheets

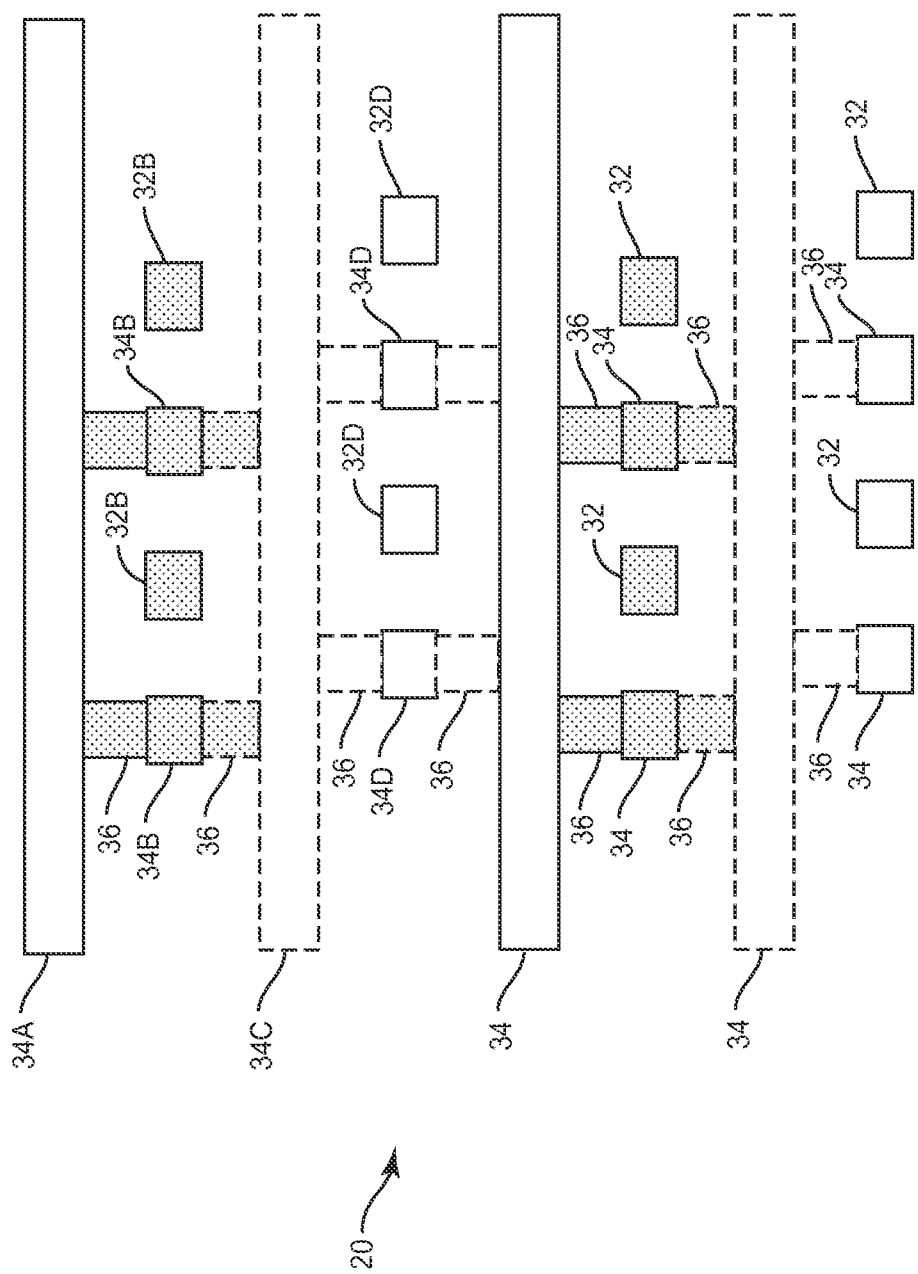

METAL-ON-METAL (MOM) CAPACITORS HAVING LATERALLY DISPLACED LAYERS, AND RELATED SYSTEMS AND METHODS

BACKGROUND

I. Field of the Disclosure

The technology of the disclosure relates to providing capacitors in semiconductor dies for use by integrated circuits.

II. Background

Mobile communication devices have become common in current society. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. These and other factors contribute to a continued miniaturization of components within the circuitry.

Miniaturization of the components impacts all aspects of the processing circuitry including the transistors and other reactive elements in the processing circuitry, such as capacitors. One miniaturization technique involves moving some reactive elements from the printed circuit board into the integrated circuitry. One technique for moving reactive elements into the integrated circuitry involves creating metal-on-metal (MoM) capacitors during back end of line (BEOL) integrated circuit fabrication. Each integrated circuit complies with a collection of process parameters that allow circuits to be manufactured and to operate under desired specifications (sometimes called a "process window"). The process window may be unique to a particular integrated circuit or may be duplicated across a product line or have other application as desired, but the existence of a corresponding process window effectively sets forth the thresholds with which an integrated circuit must comply to be suitable for use as designed (e.g. an integrated circuit in a mobile communication device).

Many current BEOL MoM capacitors use a two element interdigitated structure. Such capacitors are created using masks and metal deposition processes. In such processes, a substrate may be provided and a mask is positioned thereon. A metal deposition technique is used to generate the two conductive elements of the capacitor. In this regard, the two conductive elements form the positive and negative nodes of the capacitor. Since capacitance is a function of the size of the conductive elements, increased capacitance is achieved through larger positive and negative nodes. However, such larger nodes increase the footprint of the capacitor, defeating the miniaturization goals, and such larger nodes conflict with the process window and increase local stress significantly.

One approach used to create higher capacitance MoM devices is providing a layered interdigitated structure whereby additional layers of interdigitated structures are stacked vertically on top of each other. In this manner, the size of the nodes is effectively increased because each node has conductive elements in multiple planes. These larger nodes create a capacitor having a higher capacitance because each of the layers contributes to the overall capacitance of the device. Furthermore, additional capacitance is created between the layers. In some MoM devices, alternating layers of the interdigitated structures are rotated relative to layers above and below one another.

However, this layered approach (whether with rotation or not) suffers from cumulative errors resulting from misalignments of the conductive elements during the manufacturing process. That is, a surface irregularity on a first layer will become exacerbated as additional layers are stacked on top of the irregularity. At a minimum, each inter-metal dielectric (IMD) surface will cause the next film surface to have the same irregularity and such irregularity will negatively affect the process window. Further, it is possible that each additional layer will exaggerate the irregularity. As technologies continue to scale smaller, the relative distortion of such surface irregularity may become larger and have greater impact on the process window than in prior technologies since the BEOL process window has tighter tolerances as size becomes smaller (e.g., a one nanometer irregularity may not matter on a one micrometer scale device, but becomes much more significant on a twenty nanometer scale device (where such irregularity may account for a five percent variation)).

SUMMARY OF THE DISCLOSURE

Embodiments disclosed in the detailed description include metal-on-metal (MoM) capacitors having laterally displaced layers. Related systems and methods are also disclosed. MoM capacitors according to the embodiments disclosed herein include a plurality of vertically stacked layers that are laterally displaced relative to one another. In an exemplary embodiment, the orientation of the lateral displacement alternates. As used herein, lateral displacement means displacement in a direction substantially perpendicular to a primary axis of the conductive element. Staggered or alternating lateral displacement of the layers minimizes cumulative surface process variations as the MoM capacitor layers are disposed on top of each other in a semiconductor to form the MoM capacitor. As a result, the variances between two capacitors made according to this process are relatively small, in effect, making more reliably uniform capacitors by effectively increasing the lithography and etching process windows. Since the process makes more uniform capacitors, circuit designers can more reliably use such capacitors in their designs.

In this regard in one embodiment, a MoM capacitor is provided. The MoM capacitor comprises a first metal layer comprising a first plurality of conductive parallel segments having a first width and forming at least a portion of a first electrical conductor providing a first node of the MoM capacitor. The MoM capacitor also comprises a second metal layer comprising a second plurality of parallel segments. The second metal layer is disposed vertically on the first metal layer, wherein the second metal layer forms at least a portion of a second electrical conductor thereby forming the MoM capacitor. The first plurality of parallel segments is laterally displaced by at least one third of the first width relative to the second plurality of parallel segments. In this manner, a capacitor having uniform patterns in each metal layer and less inter-metal dielectric (IMD) surface variation with an enlarged lithography and etching process window is provided.

In another embodiment, a MoM capacitor is disclosed. The MoM capacitor comprises a first metal layer comprising a first plurality of conductive parallel segments having a first width and forming at least a portion of a first means for conduction providing a first node of the MoM capacitor. The MoM capacitor also comprises a second metal layer comprising a second plurality of parallel segments. The second metal layer is disposed vertically on the first metal layer, wherein the second metal layer forms at least a portion of a second means for conduction thereby forming the MoM capacitor. The first plurality of parallel segments is laterally displaced by at least one third of the first width relative to the second plurality of parallel segments.

In another embodiment, a method of forming a MoM capacitor is disclosed. The method comprises forming a first metal layer comprising a first plurality of parallel segments having a first width and forming at least a portion of a first electrical conductor. The method also comprises forming a second metal layer stacked vertically on the first metal layer and laterally displaced with respect thereto. The second metal layer comprises a second plurality of parallel segments, thereby forming at least a portion of a second electrical conductor thereby forming the MoM capacitor. The first plurality of parallel segments is laterally displaced by at least one third of the first width relative to the second plurality of parallel segments.

BRIEF DESCRIPTION OF THE FIGURES

FIG. 4A is a side view of the MoM capacitor of FIG. 2, with the edge elements omitted;

DETAILED DESCRIPTION

Figure 1:
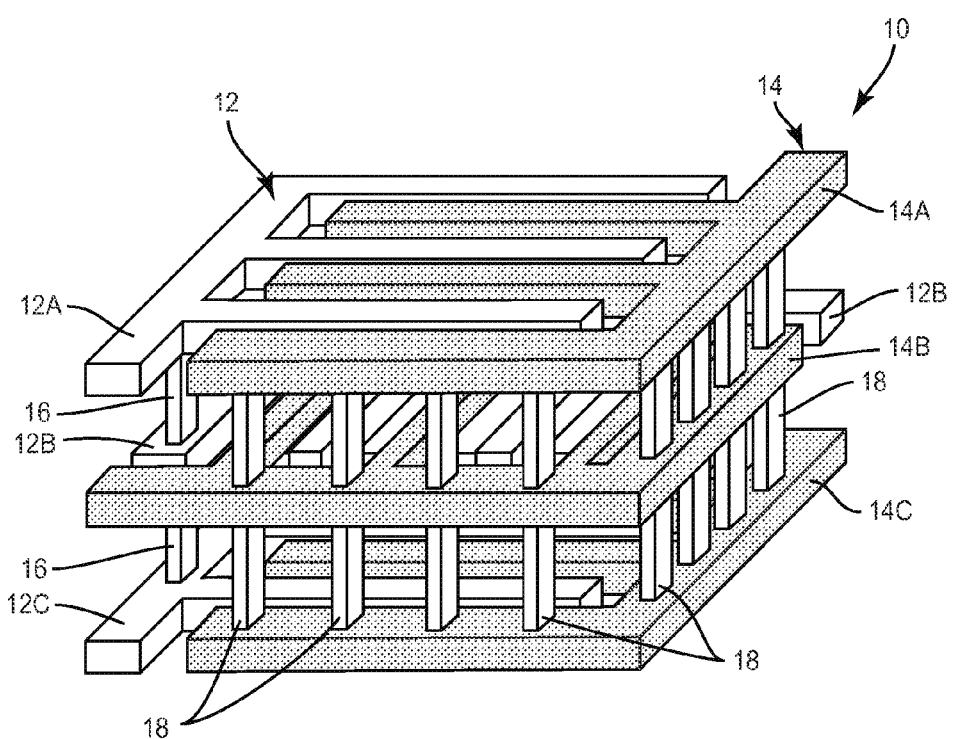
FIG. 1 is a diagram of an exemplary conventional metal-on-metal (MoM) capacitor.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include metal-on-metal (MoM) capacitors having laterally displaced layers. Related systems and methods are also disclosed. MoM capacitors according to the embodiments disclosed herein include a plurality of vertically stacked layers that are laterally displaced relative to one another. In an exemplary embodiment, the orientation of the lateral displacement alternates. As used herein, lateral displacement means displacement in a direction substantially perpendicular to a primary axis of the conductive element. Staggered or alternating lateral displacement of the layers minimizes cumulative surface process variations as the MoM capacitor layers are disposed on top of each other in a semiconductor to form the MoM capacitor. As a result, the variances between two capacitors made according to this process are relatively small, in effect, making more reliably uniform capacitors by effectively increasing the lithography and etching process windows. Since the process makes more uniform capacitors, circuit designers can more reliably use such capacitors in their designs.

Before discussing embodiments of MoM capacitors having laterally displaced layers, a brief overview of a conventional MoM capacitor is provided with reference to FIG. 1. The discussion of exemplary embodiments of MoM capacitors having laterally displaced layers begins below with reference to FIG. 2.

In this regard, FIG. 1 illustrates a conventional MoM capacitor 10 that does not include laterally displaced layers. The MoM capacitor 10 has an interdigitated structure with fingers interdigitated. The existence of these fingers causes the MoM capacitor 10 to also be referred to as a Finger Metal-on-Metal capacitor (FMoM). As used herein, the term "finger" refers to the generally rectilinear element of a node that is interdigitated with other similar generally rectilinear elements. The MoM capacitor 10 is formed from two nodes. The first node of the MoM capacitor 10 is a first conductive element 12 (formed from elements 12A, 12B, and 12C). The second node of the MoM capacitor 10 is a second conductive element 14 (formed from elements 14A, 14B, and 14C). The various elements 12A, 12B, and 12C of first conductive element 12 are electrically coupled to one another with vias 16. Similarly, the various elements 14A, 14B, and 14C of second conductive element 14 are electrically coupled to one another with vias 18.

As illustrated in FIG. 1, the elements 12A, 12B, and 12C are vertically stacked relative to one another. The elements 12A, 12B, and 12C are also designed to be directly disposed over one another so that the vias 16 are aligned. Together, the elements 12A, 14A form a layer. Likewise, elements 12B and 14B form a second layer and elements 12C and 14C form a third layer. It should be appreciated that the layers in the MoM capacitor 10 are rotated ninety degrees relative to adjacent vertical layers. That is, layer formed by 12A-14A is rotated ninety degrees relative to layer formed by 12B-14B, which is rotated ninety degrees relative to layer formed by 12C-14C.

With continuing reference to FIG. 1, process variations in the manufacturing process of the MoM capacitor 10 may result in vertical inter-metal dielectric (IMD) film variation or similarly IMD surface thickness variation at a line edge may accumulate between adjacent layers of the MoM capacitor 10. That is, IMD surface thickness variation between a first and second layer may be repeated between the second and third layers resulting in ever increasing errors as the number of layers grows. For example, if the first layer has an IMD surface variation, then the second layer may have surface variation at the same location, and the magnitude of the surface variation may be greater. Then a third layer may have another surface variation at the same location, and the magnitude of the surface variation on the third layer is even larger. As the number of layers increases, the cumulative IMD surface variation increases at the specific location. Such cumulative IMD surface variation may reduce the lithographic and etch process windows. While technology continues to scale the dimensions of the metal size and IMD thickness, such surface variation at a specific location affects the process window more than before. Further, such surface variations may result in capacitors that fall outside acceptable design thresholds or may have too great a spread of potential capacitances between capacitors to be used reliably in older technology.

Embodiments disclosed in the detailed description include MoM capacitors having laterally displaced layers. MoM capacitors according to the embodiments disclosed herein include a plurality of vertically stacked layers that are laterally displaced relative to one another. In an exemplary embodiment, the orientation of the lateral displacement is staggered or alternates. That is, a first layer is purposefully displaced in a first direction relative to a second layer and a third layer is purposefully displaced in a second, different displacement relative to the first layer. Staggered or alternating lateral displacement of the layers minimizes cumulative process variations as the MoM capacitor layers are disposed on top of each other in a semiconductor to form the MoM capacitor. That is, instead of a gradually increasing IMD thickness variation, by reversing the direction of the displacement, any IMD film thickness and process variation will be averaged across a plurality of layers so as to minimize any cumulative error. As a result, the variances of capacitors made according to this process are relatively small, in effect, making more reliably uniform capacitors. Since the layout placement averages process variation and reduces total variation, the process makes more uniform capacitors, and circuit designers can more reliably use such capacitors in their designs.

Figure 2:
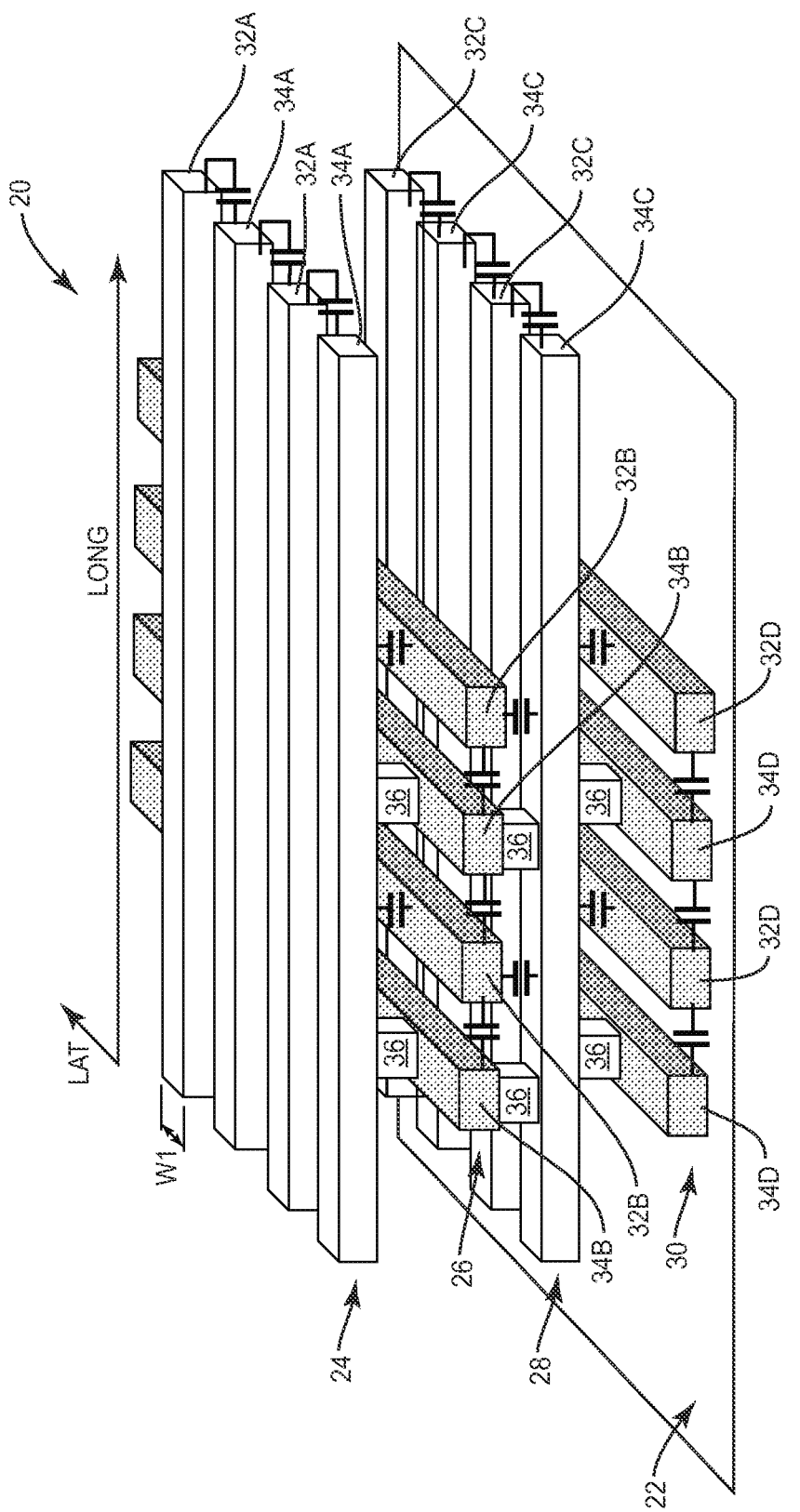
FIG. 2 is a simplified perspective view of an exemplary MoM capacitor having laterally displaced layers.
Figure 3:
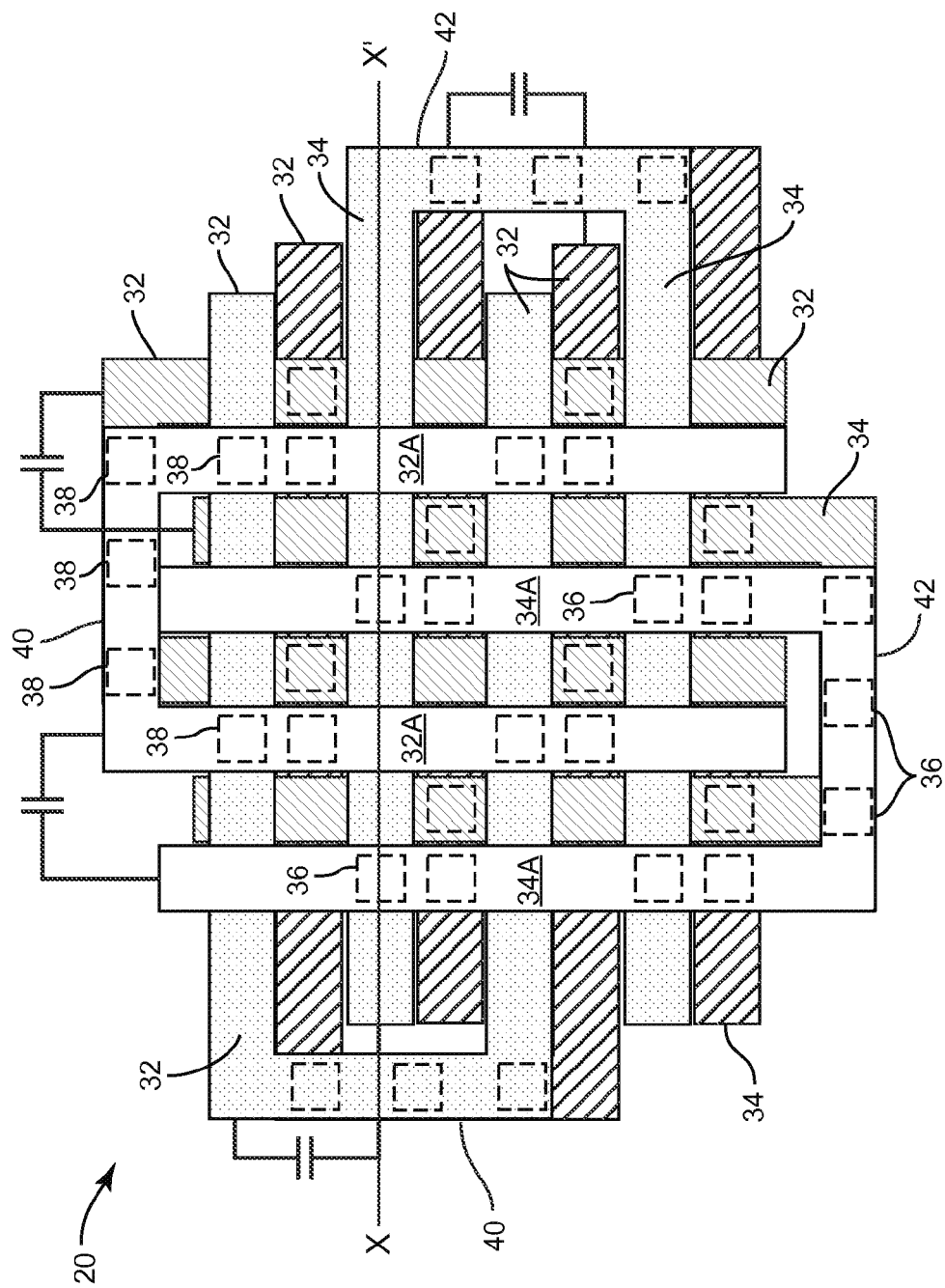
FIG. 3 is a top view of the MoM capacitor of FIG. 2, with edge elements of the MoM capacitor included.

In this regard, an exemplary MoM capacitor 20 having laterally displaced layers is illustrated in FIG. 2. The MoM capacitor 20 may be positioned on a substrate 22. In an exemplary embodiment, the substrate 22 is a semiconductor material and may be part of a semiconductor die, which may include other semiconductive elements such as transistors, diodes, and the like. For simplicity, the MoM capacitor 20 is illustrated with only four layers 24, 26, 28, and 30, although more layers may be provided, as desired. Likewise, in FIG. 2, edge components of the layers 24, 26, 28, and 30 are omitted for purposes of simplifying the illustration of the MoM capacitor 20. The edge components of the MoM capacitor 20 are illustrated in FIG. 3 and discussed in more detail below.

With reference to FIG. 2, the layer 24 of the MoM capacitor 20 is formed from interdigitated elements 32A and 34A. The layer 26 is formed from interdigitated elements 32B and 34B. The layer 28 is formed from interdigitated elements 32C and 34C. The layer 30 is formed from interdigitated elements 32D and 34D. Elements 32A, 32B, 32C, and 32D belong to a first conductive element (collectively first conductive element 32) which forms a first node of the MoM capacitor 20 and elements 34A, 34B, 34C, and 34D belong to a second conductive element (collectively second conductive element 34) which forms a second node of the MoM capacitor 20. As illustrated, the fingers of the conductive elements 32 and 34 are generally rectilinear and comprise generally parallel segments with a primary longitudinal axis. The elements 32A, 32B, 32C, and 32D alone or collectively are sometimes referred to herein as a first means for conduction. The elements 34A, 34B, 34C, and 34D alone or collectively are sometimes referred to herein as a second means for conduction.

With continued reference to FIG. 2, and as noted above, the edge elements that link the respective elements within a layer (e.g., different fingers of elements 32A to one another) have been omitted so that the rotation and lateral displacement of the layers 26, 28, 30, 32 relative to one another are more readily understood. In this exemplary embodiment, layer 30 is positioned on the substrate 22. Layer 28 is vertically stacked on top of layer 30 and is rotated ninety degrees relative to layer 30. That is, the primary longitudinal axis of the layer 30 is perpendicular to the primary longitudinal axis of the layer 28. Layer 26 is vertically stacked on top of layer 28 and is rotated ninety degrees relative to layer 28. Layer 24 is vertically stacked on top of layer 26 and is rotated ninety degrees relative to layer 26.

With continuing reference to FIG. 2, additionally, layer 24 of the MoM capacitor 20 is laterally displaced relative to layer 28. In an exemplary embodiment, layer 24 is laterally displaced by the width (W1) of a conductive element 32, 34. Likewise, layer 26 may be laterally displaced relative to layer 30. As noted above, as used herein, lateral displacement means displacement in a direction substantially perpendicular to a primary axis of the conductive element. For example, in layers 24 and 28, the primary longitudinal axis (LONG) of the elements 32A, 34A, 32C, and 34C is from left to right on the page. Thus, lateral displacement between layers 24 and 28 is into or out of the page (LAT). In an exemplary embodiment, the lateral displacement is between layers having primary axes that are parallel to one another. By way of illustration, in exemplary embodiments, W1 may be approximately forty nanometers (40) nm, thirty-two (32) nm, twenty-seven (27) nm, twenty-one (21) nm for twenty-eight (28) nm, twenty-two (22) nm, twenty (20) nm, and sixteen (16) nm, respectively, per International Technology Roadmap for Semiconductors (ITRS) feature size. Other sizes are also within the scope of the present disclosure, but these sizes are particularly contemplated.

With continued reference to FIG. 2, vias 36 couple the elements 34 from one layer to another. Additional vias 38 (not illustrated in FIG. 2, but shown in FIG. 3) couple elements 32 from one layer to another. Because of the layered nature of the MoM capacitor 20 and the interdigitated nature of the elements 32, 34, capacitance is created between adjacent elements, both laterally and vertically as noted by the various capacitor signs. Lateral displacement of the layers 24, 26, 28, and 30 minimizes cumulative process variations as the MoM capacitor layers are disposed on top of each other in a semiconductor to form the MoM capacitor. As a result, that the variances between two capacitors made according to this process are relatively small, in effect, making more reliably uniform capacitors. Since the process makes uniform capacitors, circuit designers can more reliably use such capacitors in their designs.

FIG. 3 provides a top down view of the MoM capacitor 20 in FIG. 2 with the various layers 24, 26, 28, and 30 set forth with different layer patterns to further highlight and illustrate the lateral displacement of the respective layers 24, 26, 28, and 30. Further, FIG. 3 illustrates first edge element 40 which interconnects elements 32 within a given layer and second edge element 42 which interconnects elements 34 within a given layer. Vias 36 and 38 also are shown and provide connection from layer to layer as previously discussed. With reference to FIG. 4, a cross-sectional view is provided of the MoM capacitor 20. Additional layers are provided in FIG. 4A and the lateral displacement between elements having parallel primary axes is readily seen. The addition of the extra layers also illustrates that the lateral displacement may be staggered such that layers are shifted in one direction on one layer and then shifted in a second opposite direction at a different layer. This staggered approach helps average out any cumulative thickness variations or process errors and helps keep the total capacitance of the MoM capacitor 20 within design thresholds.

Figure 4B:
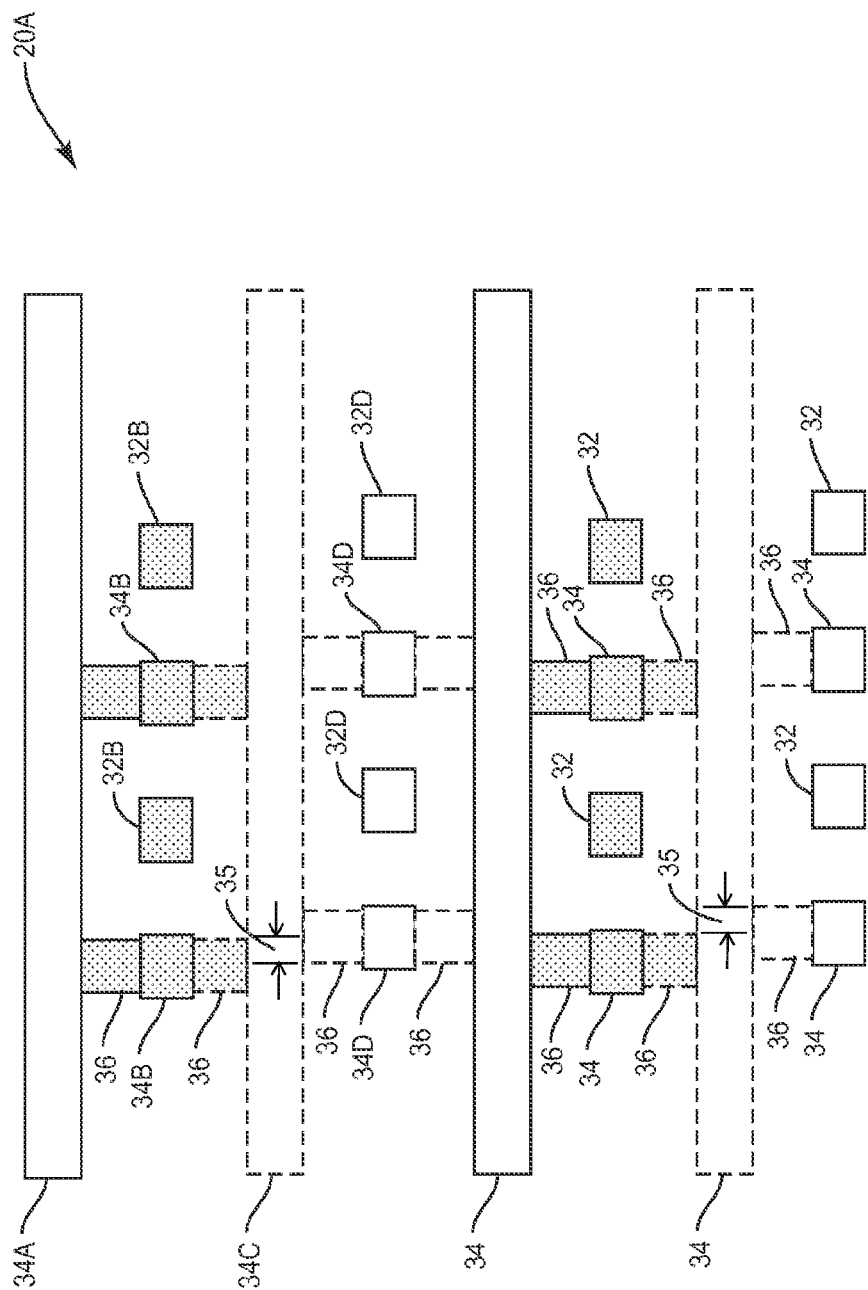
FIG. 4B is a side view of a second exemplary embodiment of the MoM capacitor of FIG. 2, with the edge elements omitted.

While the embodiment of FIG. 4A illustrates that the displacement is by the width W1 of a conductive element 32, 34, in another exemplary embodiment, the displacement may be a width that is a fraction of the width of the conductive element 32, 34. An exemplary embodiment of a MoM capacitor 20A having such alternative spacing is illustrated in FIG. 4B, where the amount of lateral displacement 35 between parallel layers is approximately one half the width W1 of a conductive element 32, 34.

It should be appreciated that other fractional displacements may also be used (for example, ¼ W1, ⅓ W1 or the like).

FIGS. 5-8 illustrate additional embodiments of MoM capacitors 70, 70A, and 70B having laterally displaced layers. FIGS. 5-8 particularly illustrate MoM capacitors 70, 70A, 70B having laterally displaced layers, wherein the alternate layers are not rotated relative to one another as opposed to the MoM capacitors 20, 20A in FIGS. 2-4B.

Figure 5:
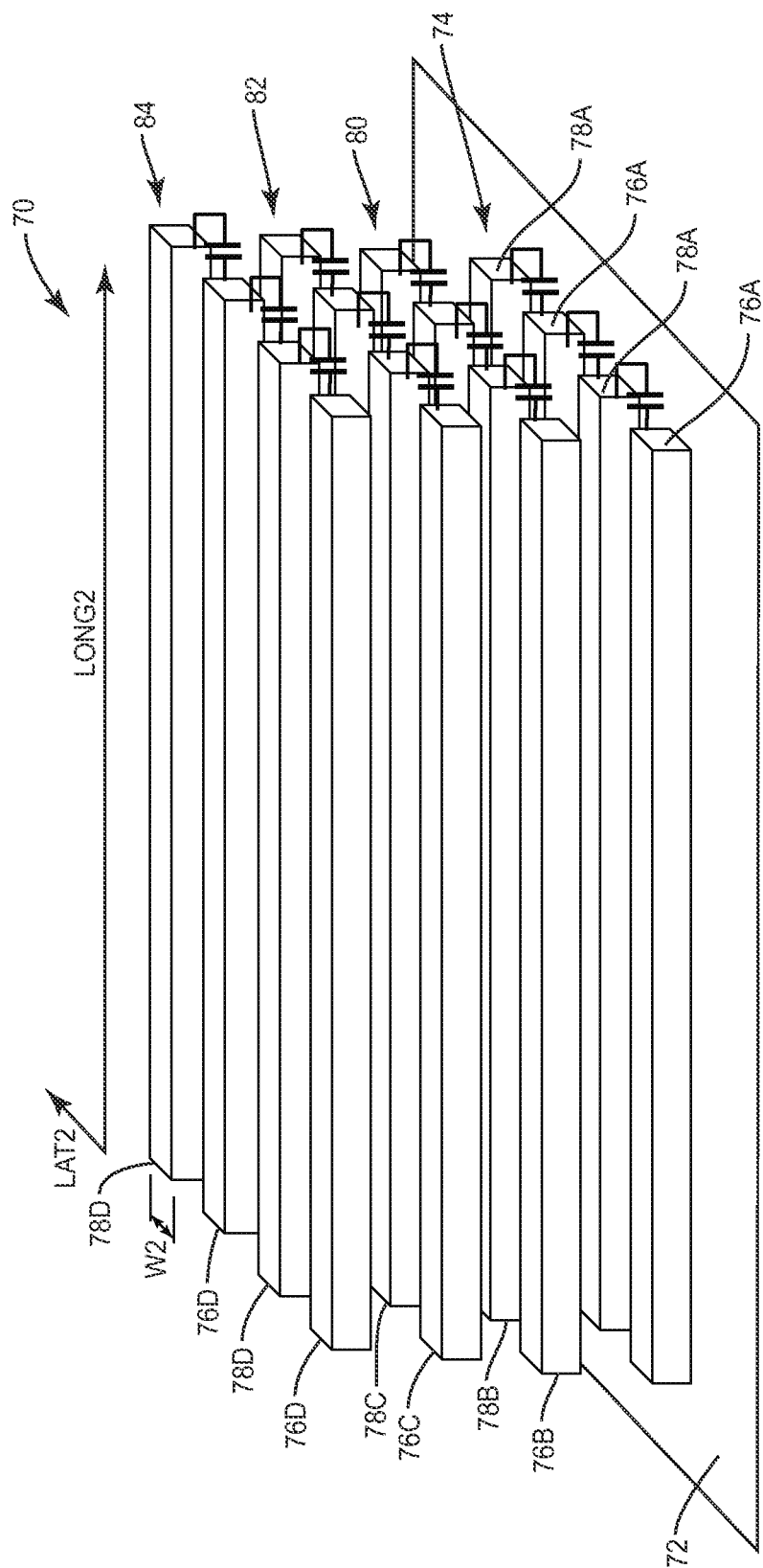
FIG. 5 is a simplified perspective view of an alternate exemplary MoM capacitor having laterally displaced layers.
Figure 6A:
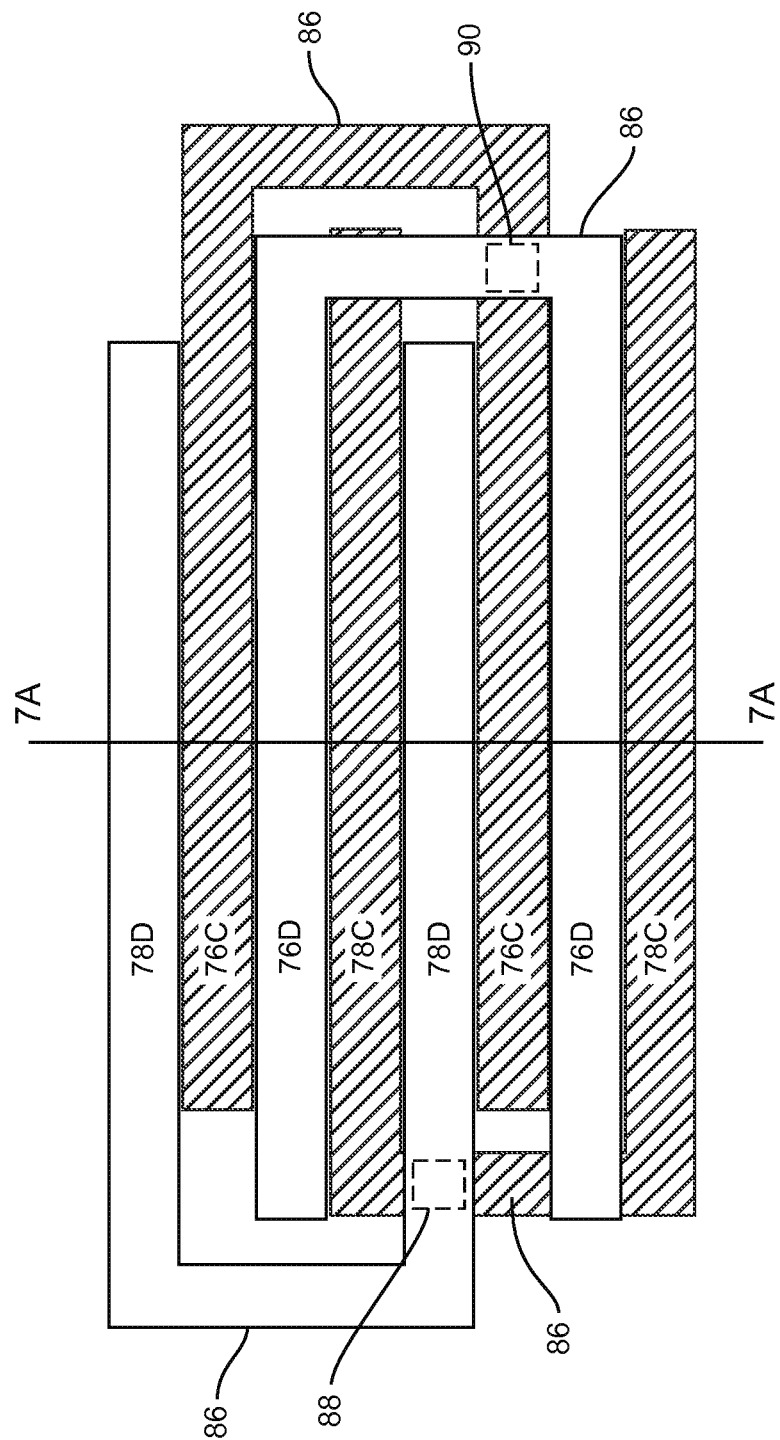
FIG. 6A is a top view of the MoM capacitor of FIG. 5 with edge elements of the MoM capacitor included.
Figure 6B:
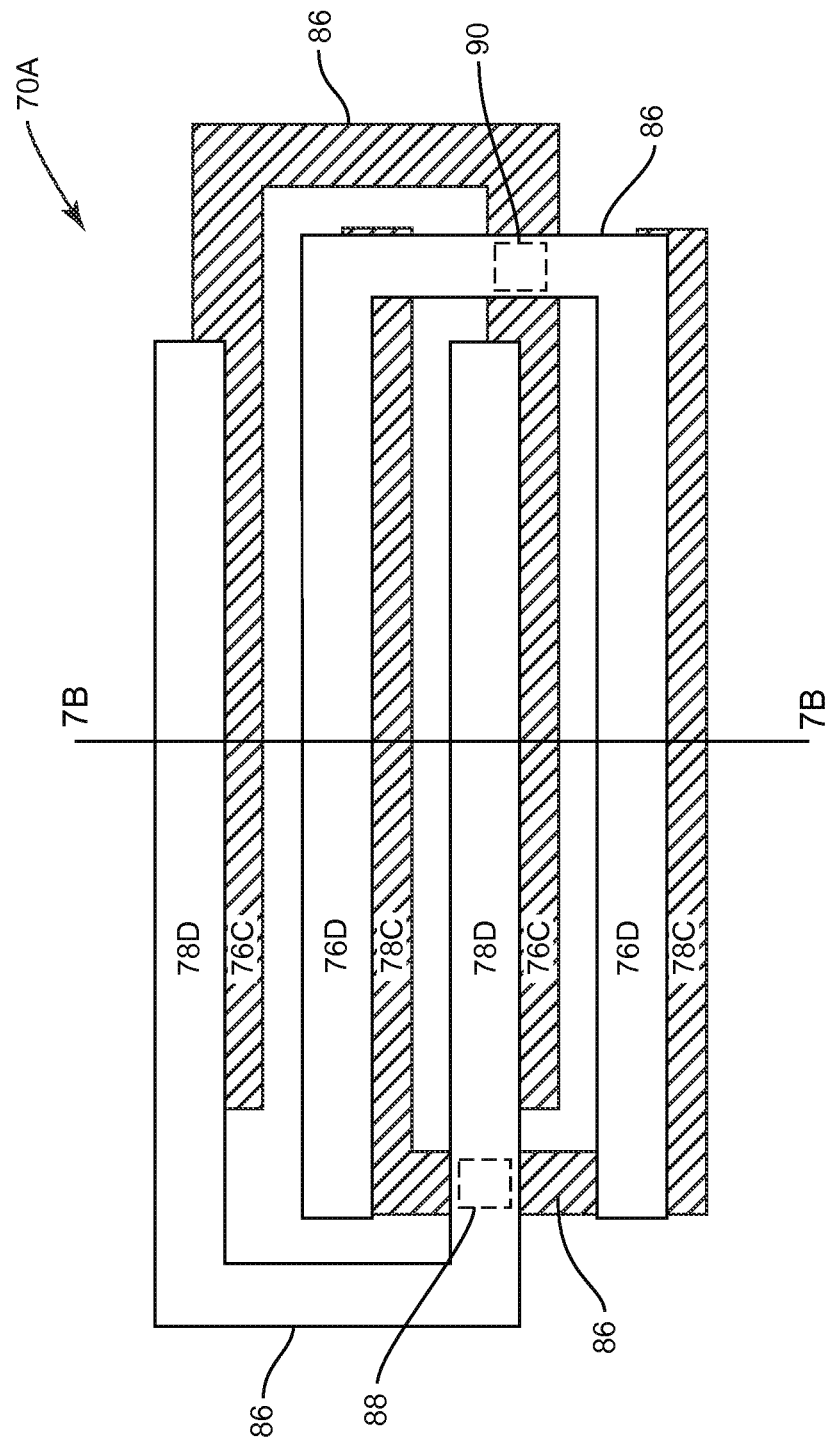
FIG. 6B is a top view of a second exemplary embodiment of the MoM capacitor of FIG. 5 with edge elements of the MoM capacitor included.

In this regard, FIG. 5 illustrates a MoM capacitor 70 having laterally displaced layers. The MoM capacitor 70 is provided on a semiconductor substrate 72. A first layer 74 of the MoM capacitor 70 is positioned on the semiconductor substrate 72 (comparable to substrate 22) and includes first conductive element 76A and second conductive element 78A arranged in a generally parallel interdigitated fashion. The fingers of the first conductive element 76A are interdigitated with respect to the fingers of the second conductive element 78A and the fingers are all generally rectilinear and parallel to one another. The edge elements 86 are not shown in FIG. 5, but are shown in FIGS. 6A and 6B. Returning to FIG. 5, additional layers 80, 82, and 84 are stacked vertically above the first layer 74 and laterally displaced relative to one another. The lateral displacement is better seen in FIGS. 6 and 7.

With continued reference to FIG. 5, the layer 80 is disposed vertically above (i.e., stacked) layer 74 and includes first conductive element 76B and second conductive element 78B arranged in an interdigitated fashion. Likewise, the layer 82 is disposed vertically above (i.e., stacked) layer 80 and includes first conductive element 76C and second conductive element 78C arranged in an interdigitated fashion. Likewise, the layer 84 is disposed vertically above (i.e., stacked) layer 82 and includes first conductive element 76D and second conductive element 78D arranged in an interdigitated fashion. The first conductive elements 76A, 76B, 76C, and 76D (collectively the first electrical conductor or first conductive element 76) form a first node for the MoM capacitor 70. Likewise, the second conductive elements 78A, 78B, 78C, and 78D (collectively the second electrical conductor or second conductive element 78) form a second node for the MoM capacitor 70. As used herein the first conductive element 76 is sometimes referred to herein as a first means for conduction. Likewise, the second conductive element 78 is sometimes referred to herein as a second means for conduction. In an exemplary embodiment (and as illustrated in FIG. 5) conductive elements 76, 78 of the same node are positioned above (albeit displaced as described herein) one another (e.g., first conductive element 76D is above first conductive element 76C). In another exemplary embodiment (not illustrated in FIG. 5), the conductive elements 76, 78 of opposite nodes are positioned above (albeit displaced as described herein) one another (e.g., first conductive element 76D is above second conductive element 78C).

In contrast to the MoM capacitor 20 in FIGS. 2-4, which has vias 36, 38 positioned at a distance or otherwise removed from the edge element, the vias 88, 90 of the MoM capacitor 70 in FIGS. 5-8 are positioned on or proximate the edge element 86 (see FIGS. 6A and 6B). As also seen in FIG. 6A, the different layers 74, 80, 82, 84 may be displaced both laterally (i.e., perpendicular to the primary axis, i.e., LAT2) and longitudinally (i.e. parallel to the primary axis, i.e., LONG2). The top down view of the MoM capacitor 70 in FIG. 6A also makes the amount of lateral displacement of the layers 74, 80, 82, 84 more apparent. In the exemplary embodiment of the MoM capacitor 70 in FIG. 6, the lateral displacement of the layers 74, 80, 82, 84 is approximately equal to the width (W1) of a conductive element 76, 78. Likewise, the longitudinal displacement may be greater than a width of the edge element 86. While the magnitude of the displacement has been illustrated as being on the order of the width of a single conductive element, the present disclosure is not so limited and other displacements may be used without departing from the scope of the present disclosure. Exemplary dimensions of W1 are set forth above in the discussion of FIG. 2 and are considered appropriate dimensions for the additional embodiments set forth herein.

In an alternate embodiment of MoM capacitor 70A, illustrated in FIG. 6B, a displacement equals to approximately one half the width W1 of conductive elements 76, 78. As noted above, other fractional width displacements (e.g., ¼ W1, ⅓ W1, or the like) are also within the scope of the present disclosure. Note that the embodiments of FIGS. 6A and 6B illustrate the situation where first conductive elements 76 of the first node are positioned above the second conductive elements 78 of the second node (e.g., 76D is above 78C) albeit displaced as described herein. Having elements 76, 78 of opposite nodes over one another increases the capacitance of the MoM capacitors 70, 70A because additional capacitance is formed vertically and not just within a horizontal plane of conductive elements.

Figure 7A:
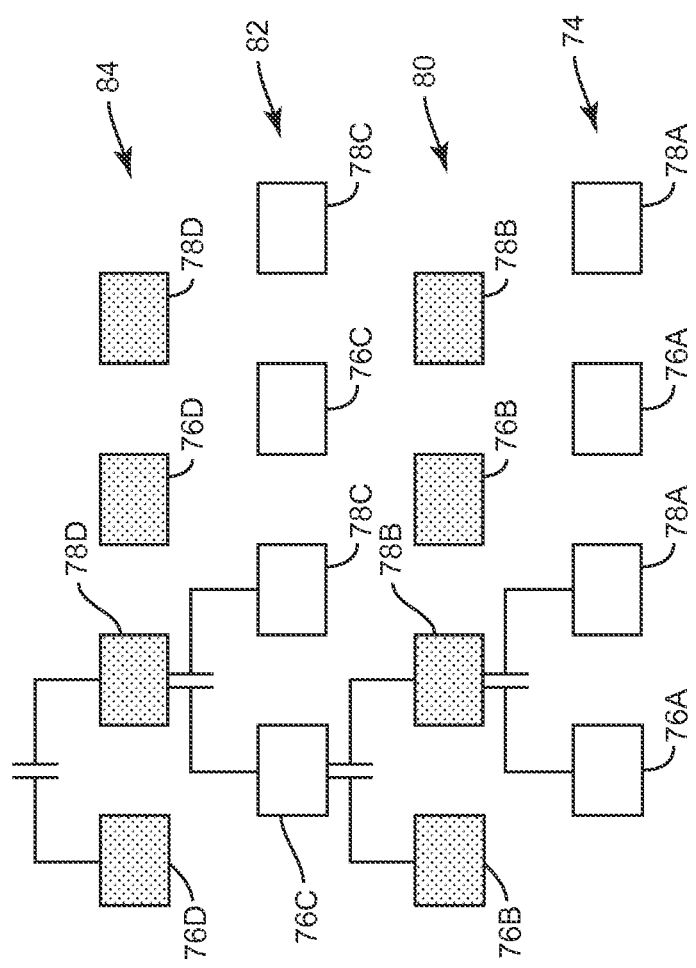
FIG. 7A is a side view of the MoM capacitor of FIG. 6A with the edge elements omitted.

With reference to FIG. 7A, the staggered nature of the displacement of the layers 74, 80, 82, 84 of the MoM capacitor 70 of FIG. 6A is seen. In particular, the layers alternate direction of lateral displacement. Thus layer 74 is "to the right" when compared to layers 80, 84, but aligned with layer 82 because layers 80, 84 are "to the left" when compared to 74, 82. This staggered displacement may assist in the placement of vias and also helps reduce cumulative thickness variation from process variations. As illustrated in FIGS. 6A and 6B, the displacement may also be longitudinal displacement.

Figure 7B:
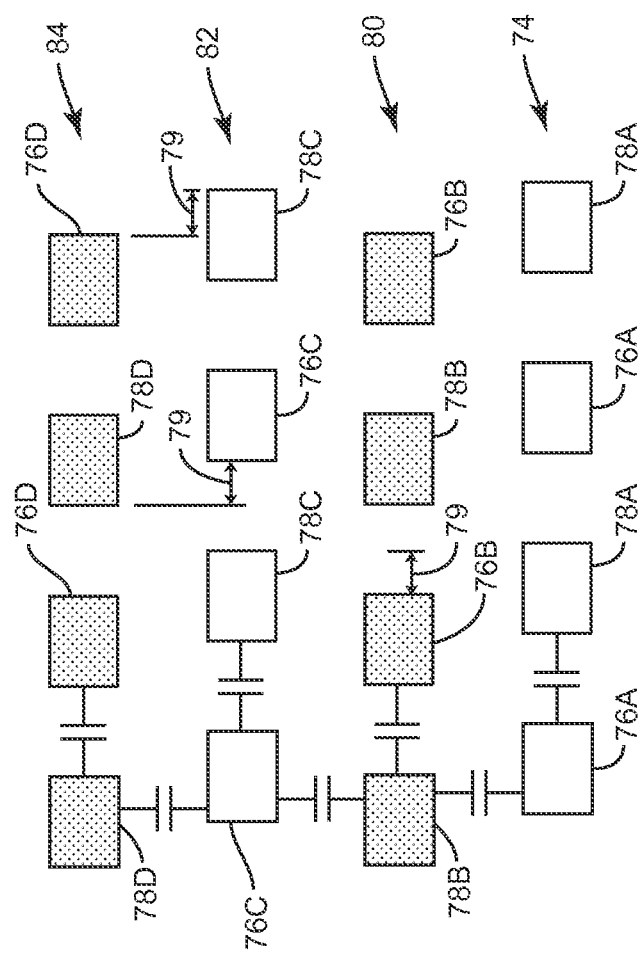
FIG. 7B is a side view of the MoM capacitor of FIG. 6B with the edge elements omitted.

With reference to FIG. 7B, a cross sectional view of the MoM capacitor 70A of FIG. 6B is illustrated and again illustrates a fractional width displacement 79 and a reversal of nodes such that first conductive element 76D is over second conductive element 78C.

Figure 8:
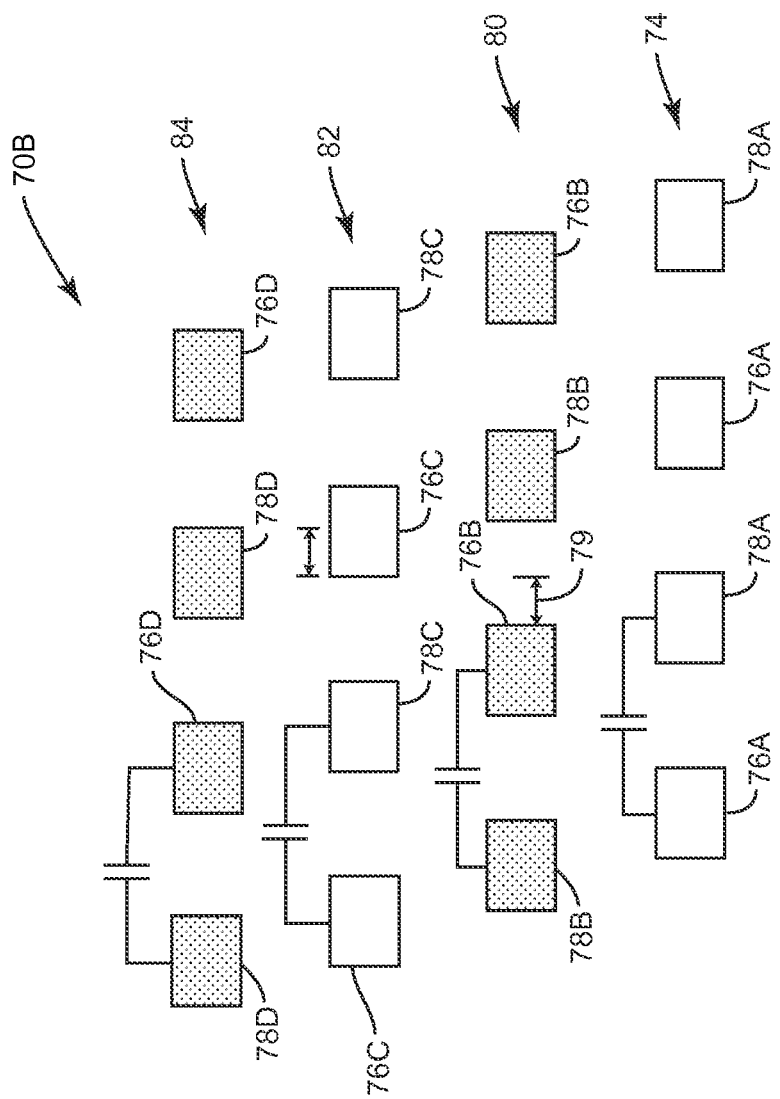
FIG. 8 is a side view of a third exemplary embodiment of the MoM capacitor of FIG. 5.

As yet another embodiment, a MoM capacitor 70B is illustrated in FIG. 8, and, instead of a displacement that alternates direction, the staggered displacement may be a slant displacement. As used herein a slant displacement means a series of displacement where the direction of the displacement is repeated across multiple levels without any reversal or change of direction in the displacement. Such slant displacement increases the overall footprint of the capacitor 70B as compared to the MoM capacitors 70, 70A, but is effective at averaging out any process variation induced thickness variations.

In this regard, an exemplary process 100 for manufacturing the MoM capacitors 20, 70 of the present disclosure is set forth with reference to FIG. 9. Initially a substrate (such as substrate 22, 72) is provided (block 102). In an exemplary embodiment, the substrate (22, 72) may be a semiconductor material or part of a semiconductor die with various semiconductive devices embedded therein. A first mask is positioned on the substrate (block 104). The process continues by forming the conductive elements (such as conductive elements 32D, 34D, 76A, 78A) of the first layer (30, 74) (block 106) through metal deposition techniques as is well understood. The mask is then removed (block 108) and the gaps between the conductive elements (32D, 34D, 76A, 78A) filled with a dielectric material (block 110). It should be appreciated that in forming the first metal layer (30, 74), the generally parallel and rectilinear fingers will be formed and they will form at least a portion of the first and second electrical conductors.

Figure 9:
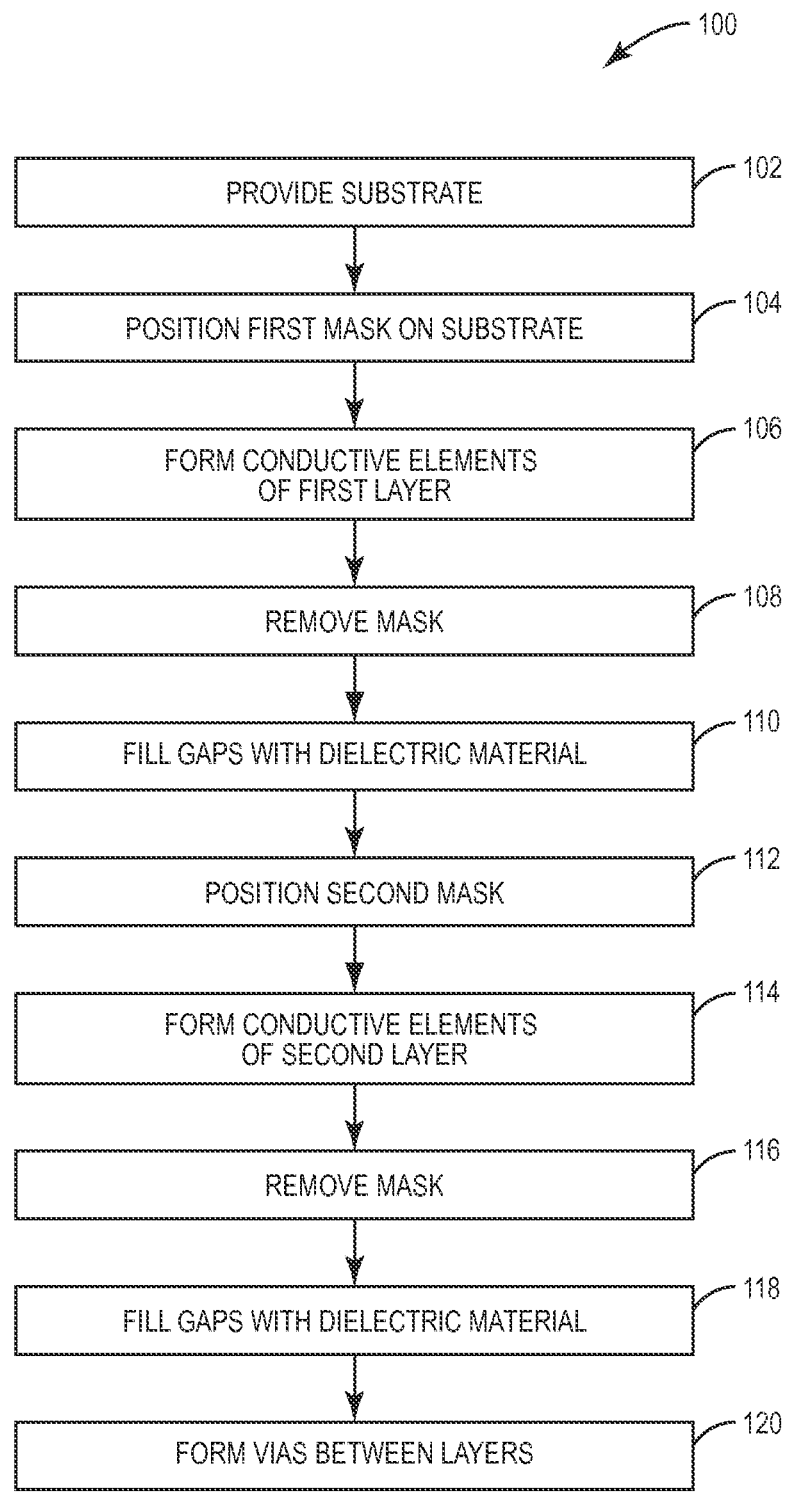
FIG. 9 is a flowchart illustrating an exemplary process for forming MoM capacitors having laterally displaced layers.

With continued reference to FIG. 9, a second mask is positioned atop the first layer (30, 74) (block 112) and the conductive elements (32C, 34C, 76B, 78B) of the second layer (28, 80) are formed (block 114) through metal deposition techniques as is well understood. The conductive elements (32C, 34C, 76B, 78B) of the second layer (28, 80) are laterally displaced relative to the conductive elements (32D, 34D, 76A, 78A) in the first layer (30, 74). The mask is removed (block 116) and the gaps between the conductive elements (32C, 34C, 76B, 78B) filled with a dielectric material (block 118). It should be appreciated that in forming the second metal layer (28, 80), the generally parallel and rectilinear fingers will be formed and will form at least a portion of the first and second electrical conductors.

With continued reference to FIG. 9, during formation of the layers or after, the vias (36, 38, 88, 90) are formed (block 120) to couple electrically the first and second layers. Additional layers and vias may be formed with additional lateral displacements. As noted above, by alternating the direction of the lateral displacement, cumulative thickness errors accumulating across multiple layers are avoided and a capacitor more likely to meet the original design criteria is created.

The MoM capacitors 20, 20A, 70, 70A, 70B according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 10:
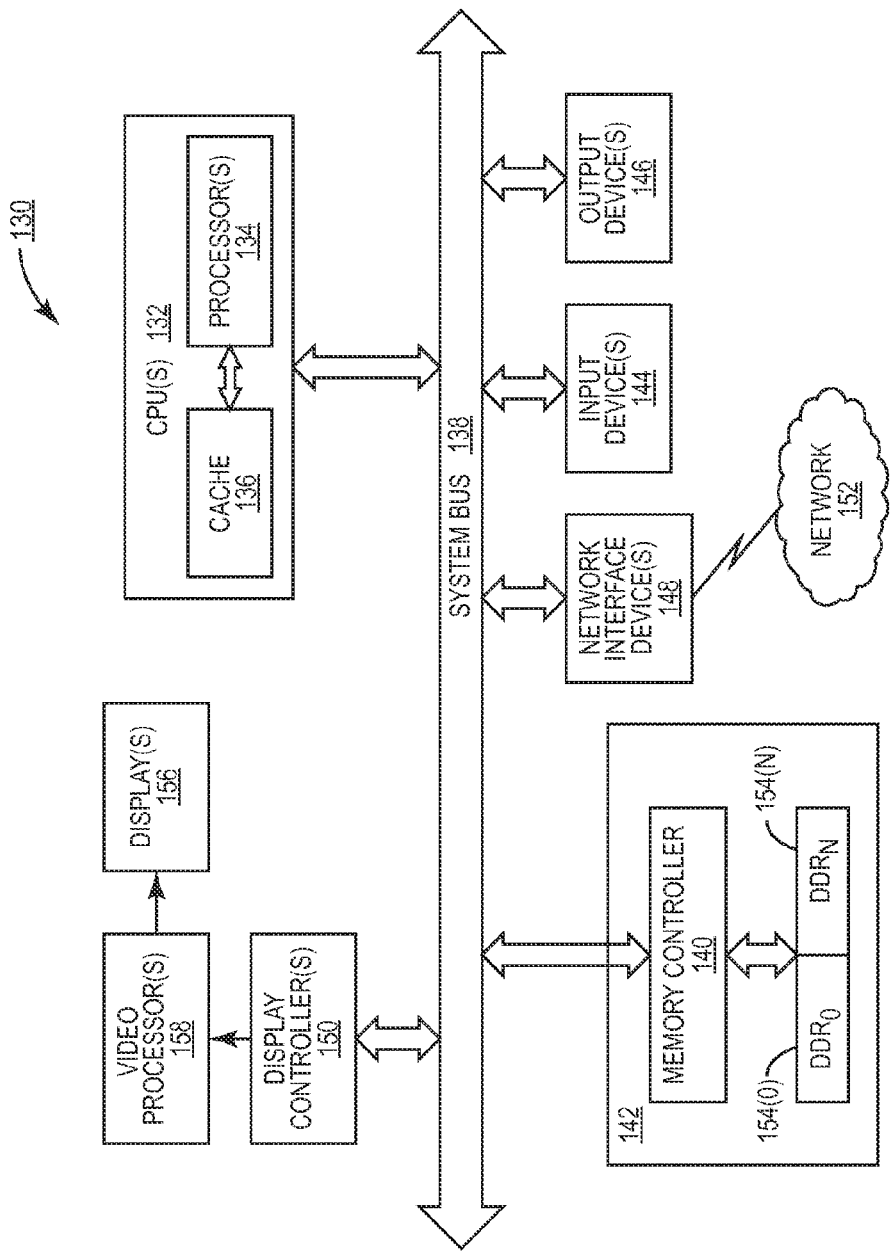
FIG. 10 is a block diagram of an exemplary processor-based system that can include the MoM capacitors having laterally displaced layers, including the MoM capacitors having laterally displaced layers according to the disclosed examples herein.

In this regard, FIG. 10 illustrates an example of a processor-based system 130 that can employ the MoM capacitors 20, 20A, 70, 70A, 70B illustrated in FIGS. 2-8. In this example, the processor-based system 130 includes one or more central processing units (CPUs) 132, each including one or more processors 134. The CPU(s) 132 may have cache memory 136 coupled to the processor(s) 134 for rapid access to temporarily stored data. The CPU(s) 132 is coupled to a system bus 138 and can intercouple master devices and slave devices included in the processor-based system 130. As is well known, the CPU(s) 132 communicates with these other devices by exchanging address, control, and data information over the system bus 138. For example, the CPU(s) 132 can communicate bus transaction requests to the memory controller 140.

Other master and slave devices can be connected to the system bus 138. As illustrated in FIG. 10, these devices can include a memory system 142, one or more input devices 144, one or more output devices 146, one or more network interface devices 148, and one or more display controllers 150, as examples. The input device(s) 144 can include any type of input device, including but not limited to input keys, switches, voice processors, etc. The output device(s) 146 can include any type of output device, including but not limited to audio, video, other visual indicators, etc. The network interface device(s) 148 can be any devices configured to allow exchange of data to and from a network 152. The network 152 can be any type of network, including but not limited to a wired or wireless network, private or public network, a local area network (LAN), a wide local area network (WLAN), and the Internet. The network interface device(s) 148 can be configured to support any type of communication protocol desired. The memory system 142 can include one or more memory units 154(0-N).

The CPU(s) 132 may also be configured to access the display controller(s) 150 over the system bus 138 to control information sent to one or more displays 156. The display controller(s) 150 sends information to the display(s) 156 to be displayed via one or more video processors 158, which process the information to be displayed into a format suitable for the display(s) 156. The display(s) 156 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), an Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM). Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A metal-on-metal (MoM) capacitor, comprising:
   a first metal layer comprising a first plurality of conductive parallel segments having a first width and forming at least a portion of a first electrical conductor providing a first node of the MoM capacitor; and
   a second metal layer comprising a second plurality of parallel segments, the second metal layer disposed vertically on the first metal layer, the second metal layer forming at least a portion of a second electrical conductor thereby forming the MoM capacitor, wherein the first plurality of conductive parallel segments is laterally displaced by at least one third of the first width relative to the second plurality of parallel segments.

2. The MoM capacitor of claim 1, wherein the first plurality of conductive parallel segments comprises at least a portion of a first interdigitated structure.

3. The MoM capacitor of claim 2, wherein the second plurality of parallel segments comprises at least a portion of a second interdigitated structure.

4. The MoM capacitor of claim 1, wherein the first metal layer further comprises a third plurality of parallel segments disposed between the first plurality of conductive parallel segments in a first interdigitated arrangement.

5. The MoM capacitor of claim 4, wherein the second metal layer further comprises a fourth plurality of parallel segments disposed between the second plurality of parallel segments in a second interdigitated arrangement.

6. The MoM capacitor of claim 1, further comprising at least one additional metal layer stacked vertically relative to the first metal layer.

7. The MoM capacitor of claim 1, further comprising a via coupling the first metal layer to the second metal layer.

8. The MoM capacitor of claim 7, wherein the first metal layer comprises an edge and the via is positioned proximate the edge.

9. The MoM capacitor of claim 7, wherein the first metal layer comprises an edge and the via is positioned interiorly removed from the edge.

10. The MoM capacitor of claim 1, further comprising a semiconductor substrate positioned beneath the first metal layer.

11. The MoM capacitor of claim 1, wherein the first width is less than approximately forty nanometers.

12. The MoM capacitor of claim 1, wherein the first plurality of conductive parallel segments is laterally displaced through a slant displacement.

13. The MoM capacitor of claim 1 integrated into a semiconductor die.

14. The MoM capacitor of claim 1, further comprising a device selected from the group consisting of: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the MoM capacitor is integrated.

15. A metal-on-metal (MoM) capacitor comprising:
    a first metal layer comprising a first plurality of conductive parallel segments having a first width and forming at least a portion of a first means for conduction providing a first node of the MoM capacitor; and
    a second metal layer comprising a second plurality of parallel segments, the second metal layer disposed vertically on the first metal layer, the second metal layer forming at least a portion of a second means for conduction thereby forming the MoM capacitor, wherein the first plurality of conductive parallel segments is laterally displaced by at least one third of the first width relative to the second plurality of parallel segments.

16. A method of forming a metal-on-metal (MoM) capacitor, comprising:
    forming a first metal layer comprising a first plurality of conductive parallel segments having a first width and forming at least a portion of a first electrical conductor; and
    forming a second metal layer stacked vertically on the first metal layer and laterally displaced with respect thereto, the second metal layer comprising a second plurality of parallel segments, forming at least a portion of a second electrical conductor thereby forming the MoM capacitor, such that the first plurality of conductive parallel segments is laterally displaced by at least one third of the first width relative to the second plurality of parallel segments.

17. The method of claim 16, wherein forming the first metal layer comprises forming a third plurality of parallel segments disposed between the first plurality of conductive parallel segments in a first interdigitated arrangement.

18. The method of claim 17, wherein forming the second metal layer comprises forming a fourth plurality of parallel segments disposed between the second plurality of parallel segments in a second interdigitated arrangement.

19. The method of claim 16, further comprising forming a via between the first metal layer and the second metal layer.

20. The method of claim 19, wherein forming the via comprises forming the via near an edge of the first metal layer.

21. The method of claim 19, wherein forming the via comprises forming the via removed from an edge of the first metal layer.

22. The method of claim 16, further comprising forming the first metal layer on a semiconductor substrate.

\* \* \* \* \*